US006965256B2

(12) United States Patent
Cheng

(10) Patent No.: US 6,965,256 B2
(45) Date of Patent: Nov. 15, 2005

(54) CURRENT MODE OUTPUT STAGE CIRCUIT WITH OPEN LOOP DC OFFSET REDUCTION

(75) Inventor: Jackie Cheng, Irvine, CA (US)

(73) Assignee: Wionics Research, Irvine, CA (US)

( * ) Notice: Subject to any disclaimer, the term of this patent is extended or adjusted under 35 U.S.C. 154(b) by 0 days.

(21) Appl. No.: 10/856,076

(22) Filed: May 28, 2004

(65) Prior Publication Data

US 2005/0195021 A1 Sep. 8, 2005

Related U.S. Application Data

(60) Provisional application No. 60/550,433, filed on Mar. 5, 2004.

(51) Int. Cl.[7] .................................................. H03F 3/45
(52) U.S. Cl. .......................................... 327/53; 327/66
(58) Field of Search ............................. 327/52–53, 55, 327/58, 60, 62–66, 69, 72, 77–83, 85, 89–90, 327/306–307, 560–563; 323/315–316; 330/9, 330/253, 257, 258, 28

(56) References Cited

U.S. PATENT DOCUMENTS

| | | | | |
|---|---|---|---|---|
| 5,886,546 A * | 3/1999 | Hwang | ........................ | 327/103 |
| 6,194,921 B1 * | 2/2001 | Fujiwara | ........................ | 327/65 |

* cited by examiner

*Primary Examiner*—My-Trang Nu Ton
(74) *Attorney, Agent, or Firm*—Foley & Lardner LLP

(57) ABSTRACT

An output stage circuit for a current mode device provides open loop reduction or cancellation of DC offset in differential output signals. Differential input signals are received and sourcing current mirrors provide mirrors of the differential input signals to output nodes. Sinking current mirrors also provide mirrors of opposite polarity of the differential input signals to the output nodes corresponding to the opposing sourcing current mirrors. The summing of the mirror currents at the output nodes substantially reduces or eliminates the DC offset components present in the input signals.

14 Claims, 5 Drawing Sheets

CURRENT MODE OUTPUT STAGE CIRCUIT WITH OPEN LOOP DC OFFSET REDUCTION

BACKGROUND

1. Field of the Invention

Embodiments of the present invention relate to DC offset reduction techniques for differential signals, and, in particular, to DC offset reduction techniques for signal handling elements such as amplifiers, mixers and current mode down converters.

2. Description of Related Art

The performance of an electronic device depends on the performance of the individual elements that constitute the device. For example, the performance of electronic devices such as cellular telephones, personal digital assistants and other wireless and wired devices depend heavily on the performance of the various signal handling elements of the device. The output provided by each element influences the performance of each subsequent element. Consequently, the quality of the output signal produced by an element can be critical to the performance of the device in general.

One goal of circuits that use differential signals is to minimize any DC offset in the output signals. DC offset may be eliminated using a feedback loop, however feedback loops are complex and consume significant space and power. As an alternative, an open loop DC offset compensation circuit may be utilized in the output stage. FIG. 1 shows a circuit level diagram of a conventional current mode output stage circuit for supplying differential output signals. An input signal $I_{in}$ composed of a DC bias component $I_{DC1}$ and a signal component $I_{sig}$ is received at a first input 10, and a complementary input signal $-I_{in}$ composed of a DC bias component $I_{DC2}$ and a complementary signal component $-I_{sig}$ is received at an input 18. Ideally the DC bias components $I_{DC1}$ and $I_{DC2}$ of the input signals are equal. Any difference between the DC bias components is referred to as DC offset.

In the output stage circuit of FIG. 1, the input signal $I_{in}$ is provided to a reference PMOS transistor 12 that is coupled to the input 10. Current in the reference transistor 12 is mirrored in a mirror transistor 14 that has its gate coupled to the gate of the reference transistor 12, and the mirror current is supplied to an output 16. The complementary input signal $-I_{in}$ is provided to a reference PMOS transistor 20 that is coupled to the input 18. Current in the reference transistor 20 is mirrored in a mirror transistor 22 that has its gate coupled to the gate of the reference transistor 20, and the mirror current is supplied an output 24. The reference transistors 12, 20 and the mirror transistors 14, 22 are implemented as matched pairs.

The ideal output stage circuit supplies the signal components of the input signals to the outputs without DC bias or DC offset. In the conventional output stage circuit of FIG. 1, DC bias is removed by bias transistors 26, 28 that are coupled to the output nodes 16, 24 to supply DC counter-bias currents. The amount of current supplied by each bias transistor is controlled by respective bias control voltages $V_{bias1}$, $V_{bias2}$ supplied to the gates 30, 32 of the bias transistors 26, 28.

It is difficult to approximate ideal operation with the conventional output stage circuit of FIG. 1. The bias control voltages $V_{bias1}$, $V_{bias2}$ are typically set once for the circuit, and cannot be adjusted to compensate for any DC offset that occurs in the input signals. Since the counter-bias currents supplied by the PMOS bias transistors 26, 28 will only match the bias currents of the NMOS mirror transistors 14, 22 at limited process, temperature and voltage conditions, the circuit is very sensitive to a number of factors including the properties of the individual transistors and changes in the DC bias components of the input signals, and therefore is only somewhat effective for removing DC offset.

SUMMARY

In accordance with preferred embodiments of the invention, a circuit that produces differential output signals includes an output stage that substantially suppresses or eliminates DC offset in the output signals. In accordance with preferred embodiments, the output stage receives differential input signals, and each of the differential input signals is supplied to a respective sourcing current mirror and a respective sinking current mirror. The characteristics of the sourcing and sinking current mirrors are matched so as to provide approximately the same gain with respect to the input signals. The respective sourcing current mirrors supply a mirror of each of the differential input signals to a corresponding output of the output stage. The respective sinking current mirrors supply a mirror of each differential input signal to the output corresponding to the opposite input signal. By summing the sourcing and sinking current mirrors provided to each output as described above, the DC bias components of the input signals are substantially eliminated in the output signals in a manner that is substantially insensitive to changes in the magnitude of the DC bias components of the input signals, and any DC offset between the input signals is substantially eliminated in the output signals.

In accordance with preferred embodiments, a method in an output stage for reducing DC offset in a differential signal pair is provided. An input current $I_{in}$ and a complementary input current $-I_{in}$ are received by the output stage. A first mirror of the input current $I_{in}$ is supplied to a first output node, and a second mirror of the input current $I_{in}$ is supplied to a second output node. The second mirror of the input current $I_{in}$ has a polarity with respect to the second output node that is opposite the polarity of the first mirror of the input current $I_{in}$ with respect to the first output node. In addition, a first mirror of the complementary input current $-I_{in}$ is supplied to the second output node. The first mirror of the complementary input current $-I_{in}$ has a polarity with respect to the second output node that is the same as the polarity of the second mirror of the input current $I_{in}$ with respect to the second output node. In addition, a second mirror of the complementary input current $-I_{in}$ is supplied to the first output node. The second mirror of the complementary input current $-I_{in}$ has a polarity with respect to the first output node that is the same as the polarity of the first mirror of the input current $I_{in}$ with respect to the first output node. Consequently, a first output current $I_{out}$ equals the sum of the first mirror of the input current $I_{in}$ and the second mirror of the complementary input current $-I_{in}$, and a second complementary output current $-I_{out}$ equals the sum of the second mirror of the input current $I_{in}$ and the first mirror of the complementary input current $-I_{in}$.

In accordance with further preferred embodiments, an output stage for a current mode circuit comprises a first reference transistor for receiving an input current $I_{in}$, a first sourcing current mirror for producing a mirror of the input current $I_{in}$ at a first output node, and a first sinking current mirror for producing a mirror of the input current $I_{in}$ at a second output node, the polarity of current produced by the first sinking current mirror being opposite to the polarity of current produced by the first sourcing current mirror. The output stage further includes a second reference transistor for receiving a complementary input current $-I_{in}$, a second sourcing current mirror for producing a mirror of the complementary input current $-I_{in}$ at the second output node, and a second sinking current mirror for producing a mirror of the complementary input current $-I_{in}$ at the first output node, the polarity of current produced by the second sinking current mirror being opposite to the polarity of current produced by the second sourcing current mirror.

The reference transistors, sourcing current mirrors and sinking current mirrors are preferably implemented using matched transistors. The gains of the sourcing current mirrors are preferably approximately equal to the gains of the sinking current mirrors. Additional elements for controlling the output impedance of the output stage may also be included. Multiple sets of matched sourcing and sinking current mirrors may be switchable into and out of the output stage circuit to provide a programmable output stage gain.

DESCRIPTION OF THE DRAWINGS

A detailed description of embodiments of the invention will be made with reference to the accompanying drawings, wherein like numerals designate corresponding parts in the several figures.

DETAILED DESCRIPTION

In the following description of preferred embodiments, reference is made to the accompanying drawings which form a part hereof, and in which are shown by way of illustration specific embodiments in which the invention may be practiced. Other embodiments may be utilized and structural changes may be made without departing from the scope of the invention.

Figure 2:
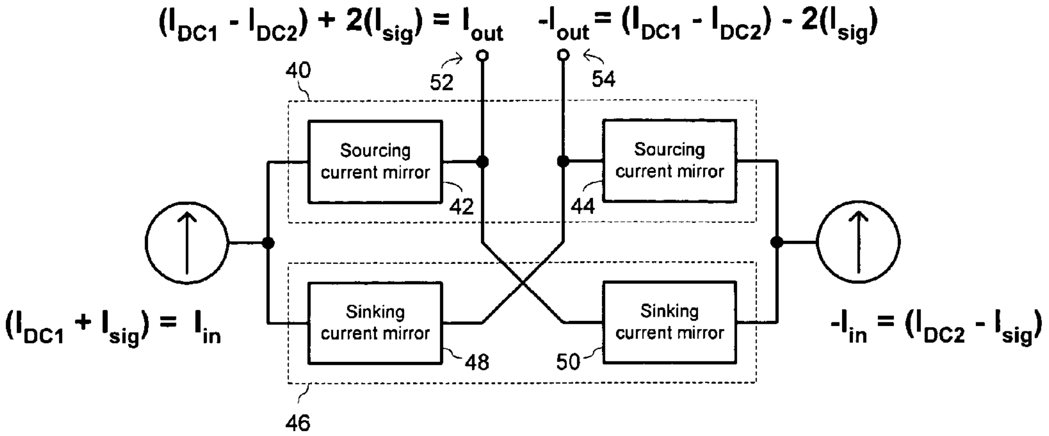
FIG. 2 shows a block level schematic diagram of an open loop output stage circuit in accordance with preferred embodiments of the invention.

FIG. 2 shows a block level schematic diagram of an output stage circuit in accordance with preferred embodiments of the present invention. The circuit of FIG. 2 receives differential input currents $I_{in}$ and $-I_{in}$ that include DC bias components having the same polarity, and generates differential output currents $I_{out}$ and $-I_{out}$ in which the bias components and any DC offset between the signals are reduced or eliminated. The output stage circuit is comprised of a pair of sourcing current mirrors 42, 44 and a pair of sinking current mirrors 48, 50. For purposes of this disclosure, the terms "sourcing" and "sinking" are used to differentiate between the relative effect that each type of current mirror has on the direction or polarity of current that it produces at its output with reference to the direction or polarity of its reference current. Given a reference current, the sourcing current mirror will produce a mirror of the reference current having first polarity (which may the same as or opposite to the polarity of the reference current), and the sinking current mirror will produce a mirror of the reference current having a second polarity opposite to that of the current produced by the sourcing current mirror. Thus, for example, in the circuit of FIG. 2, the polarity of the current produced by the sourcing current mirror 42 is opposite to that of the current produced by the sinking current mirror 48. Similarly, the polarity of the current produced by the sourcing current mirror 44 is opposite to that of the current produced by the sinking current mirror 50.

The sourcing current mirrors 42, 44 are provided as a matched pair, and the sinking current mirrors 48, 50 are provided as a matched pair. In addition, the characteristics of the sinking and sourcing current mirrors are matched to produce approximately equal gain with respect to their reference currents. Each sourcing current mirror 42, 44 is coupled to a corresponding output node 52, 54, and each sinking current mirror 48, 50 is coupled to the output node opposite to the output node of its corresponding sourcing current mirror 42, 44.

Consequently, each output node 52, 54 sees the sum of the outputs of the corresponding sourcing current mirror and the opposite sinking current mirror. For example, the output node 52 sees the sum of the output of the sourcing current mirror 42 and the sinking current mirror 50. The sourcing current mirror 42 provides a mirror of the input current $I_{in}$ or $(I_{DC1}+I_{sig})$, while the sinking current mirror provides a mirror of the complementary input current $-I_{in}$ or $(I_{DC2}-I_{sig})$. Noting that the polarity of the current produced by the sinking current mirror 50 is opposite to that of the current produced by the sourcing current mirror 42, and assuming that the characteristics of the sinking and sourcing current mirrors are matched to produce approximately equal gain with respect to the reference currents, the current seen at the output node 52 is:

$$(I_{DC1}+I_{sig})+(-(I_{DC2}-I_{sig}))=(I_{DC1}-I_{DC2})+2(I_{sig})$$

Similarly, the current seen at the complementary output node 54 is $(I_{DC1}-I_{DC2})-2(I_{sig})$. In the case where the DC bias components $I_{DC1}$ and $I_{DC2}$ are approximately equal, the output signals will contain essentially no DC bias components and will contain only the signal components of the input signals. In the case where the DC bias components $I_{DC1}$ and $I_{DC2}$ are not equal due to a DC offset between the input signals, the output signals will contain equal DC bias components having a magnitude equal to the difference $(I_{DC1}-I_{DC2})$ of the DC bias components of the input signals.

Figure 3:
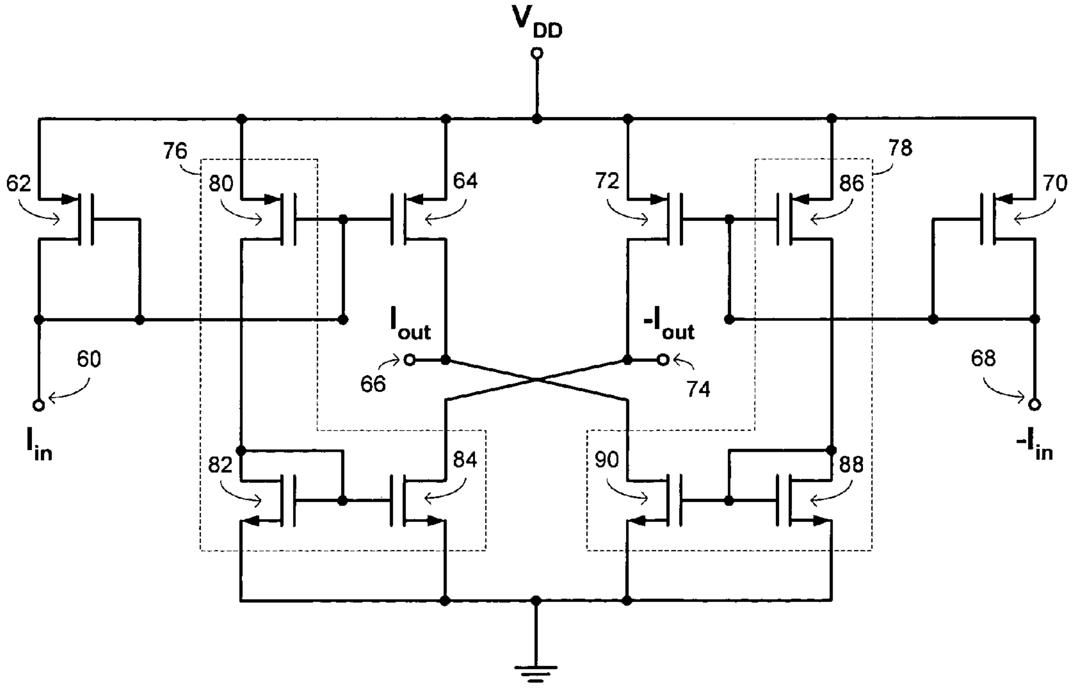
FIG. 3 shows a component level schematic diagram of an output stage circuit in accordance with a first preferred embodiment of the invention.

FIG. 3 shows a circuit level diagram of an output stage circuit in accordance with a first preferred embodiment of the invention. An input signal $I_{in}$ received at a first input 60 is received by a reference PMOS transistor 62. Current in the reference transistor 62 is mirrored in a PMOS mirror transistor 64 that has its gate coupled to the gate of the reference transistor 62. The mirror transistor 64 acts as a sourcing current mirror that drives an output 66. The circuit likewise includes complementary components for receiving and mirroring a complementary input signal $-I_{in}$, including an input 68, a PMOS reference transistor 70 receiving the complementary input signal, and a PMOS mirror transistor 72 that mirrors the reference transistor 70 and drives an output 74. The PMOS reference transistors 62, 70 are provided as a matched pair, and the PMOS mirror transistors 64, 72 are provided as a matched pair. This minimizes the creation of DC offset between the components of the output signals generated by the sourcing mirror transistors 64, 72. The transistors are preferably matched through simultaneous fabrication to the same physical dimensions using the same materials and doping profiles.

The output stage circuit of FIG. 3 further includes sinking current mirrors 76, 78 for producing mirrors of the input currents that are opposite in polarity to the mirrors of the sourcing current mirrors 64, 72. A first of the sinking current mirrors includes a PMOS mirror transistor 80 that has its gate connected to the gate of the reference transistor 62 to mirror the current in the reference transistor 62. The mirror transistor 80 drives an NMOS reference transistor 82 that is coupled to the drain of the mirror transistor 80. An NMOS mirror transistor 84 has its gate coupled to the gate of the NMOS reference transistor 82 and drives the output 74. The second of the sinking current mirrors 78 is constructed in a similar manner, including a PMOS mirror transistor 86 that mirrors the reference transistor 70, an NMOS reference transistor 88 that is driven by the PMOS mirror transistor 86, and an NMOS mirror transistor 90 that mirrors the NMOS reference transistor 88 and drives an output node 66. The PMOS mirror transistors 80, 86 are preferably matched with each other and with the mirror transistors 64, 72. Likewise the NMOS reference transistors 82, 88 and the NMOS mirror transistors 84, 90 are also preferably matched. The PMOS and NMOS transistor parameters are selected so that the ratio between the currents produced by the sourcing current mirrors and the sinking current mirrors is as close as possible to 1. Matching the characteristics of the transistors in this way helps to minimize differences in individual transistor behavior and eliminates essentially all DC offset and most or all DC bias.

Figure 1:
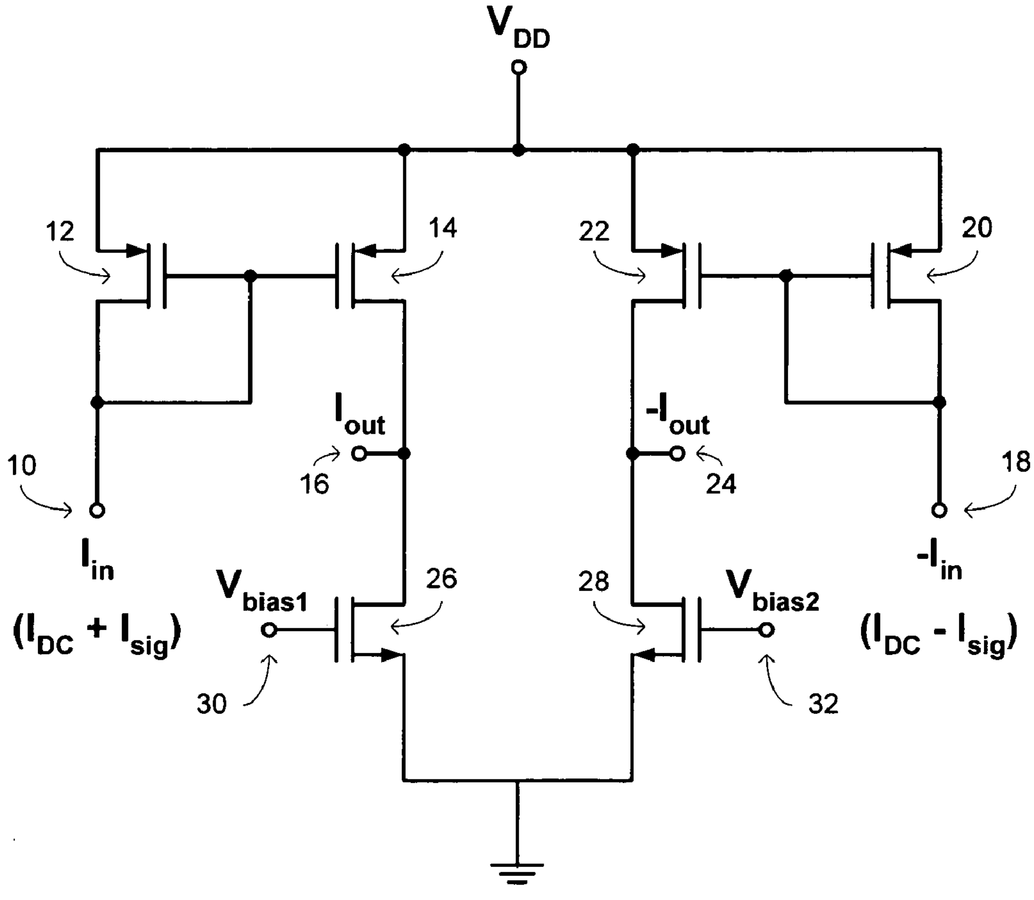
Figure 1 Prior Art
FIG. 1 shows a schematic diagram of a conventional open loop output stage circuit.

Comparing FIG. 3 to FIG. 1, it is seen that the circuit of FIG. 3 improves over the circuit of FIG. 1 in several ways. First, comparing the transistors 84, 90 of FIG. 3 to the bias transistors 30, 32 of FIG. 1, it is seen that the bias voltage applied to the gates of the transistors 84, 90 varies with the magnitude of the input signals. This allows the currents supplied by the transistors 84, 90 to vary in accordance with variations in the magnitude of the DC bias components of the input signals, making the sinking currents responsive to the magnitude of DC bias in the input currents. Also, the sinking current supplied to each output node is a mirror of the input current that is complementary to the input current from which the sourcing current for that output node is generated. Consequently, if there is any offset between the DC bias components of the differential input signals, that offset is reduced or eliminated in the output signals.

Figure 4:
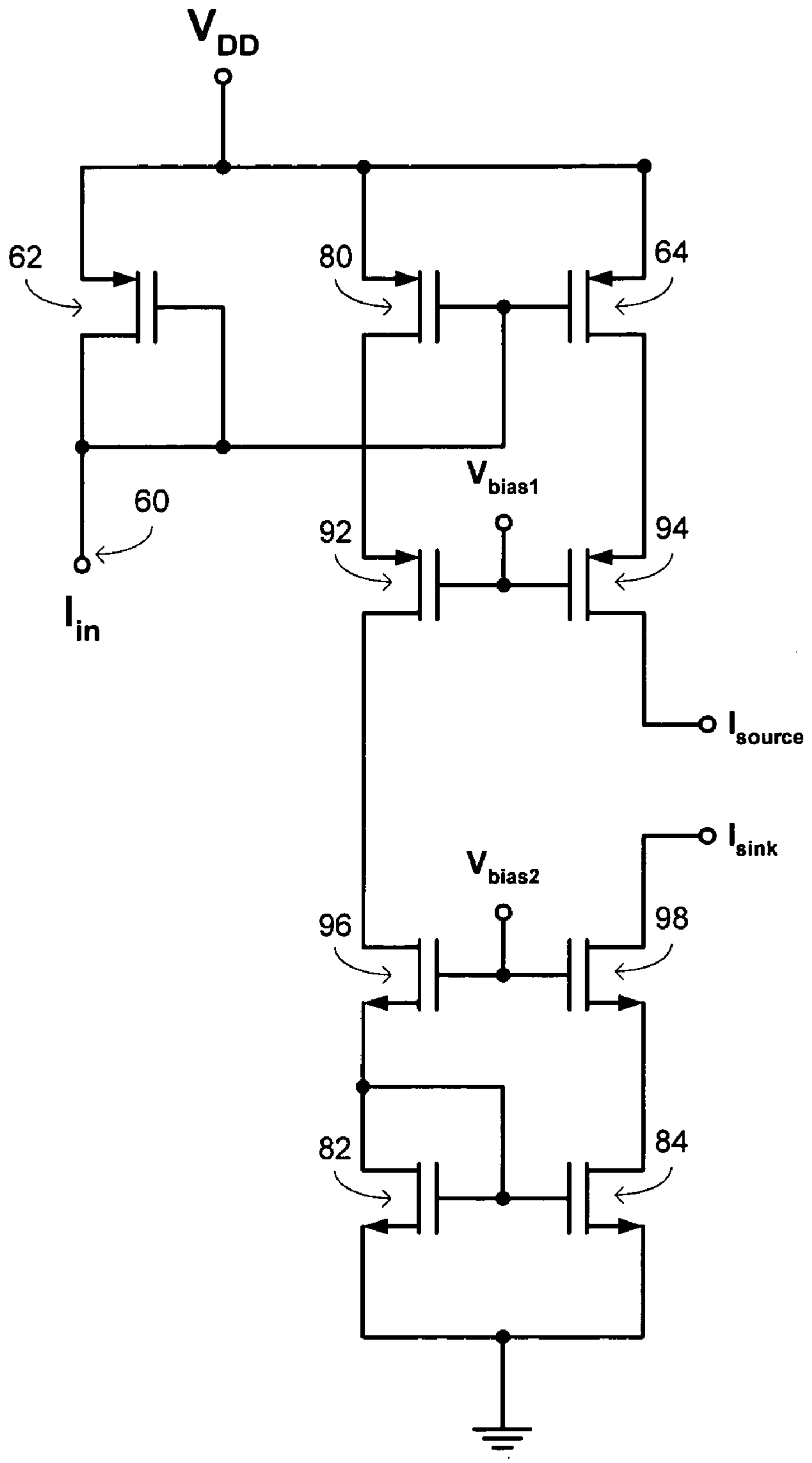
FIG. 4 shows a component level schematic diagram of one side of an output stage circuit in accordance with a second preferred embodiment of the invention.

FIG. 4 shows one side of an output stage circuit in accordance with a second preferred embodiment of the invention. The circuit of FIG. 4 is similar to the left-hand portion of the circuit of FIG. 3, in that it includes a reference transistor 62 for receiving an input current, a mirror transistor 64 that serves as a sourcing current mirror, and a sinking current mirror composed of a mirror transistor 80, a reference transistor 82 and a mirror transistor 84. In addition, the circuit of FIG. 4 includes PMOS transistors 92, 94 that are coupled in a cascode fashion with the PMOS mirror transistors 80, 64. The transistors 92, 94 are used to increase the output impedance of the output stage as seen from the output node. The output impedance of the circuit is controlled through the application of a bias voltage $V_{bias1}$ to the gates of the transistors. Similarly, the circuit of FIG. 4 includes NMOS transistors 96, 98 that are coupled in a cascode fashion with the NMOS reference transistor 82 and mirror transistor 84. The resistance provided by the transistors 96, 98 is controlled through the application of a bias voltage $V_{bias2}$ to the gates of the transistors. The bias voltages $V_{bias1}$, $V_{bias2}$ will vary depending on the particular implementation. In general, these voltages are chosen so that all of the transistors are maintained at saturation. Although not shown in FIG. 4, complementary matched sourcing and sinking current mirrors and transistors for providing additional impedance are provided for each of the illustrated transistors to mirror a complementary input signal $-I_{in}$.

Figure 5:
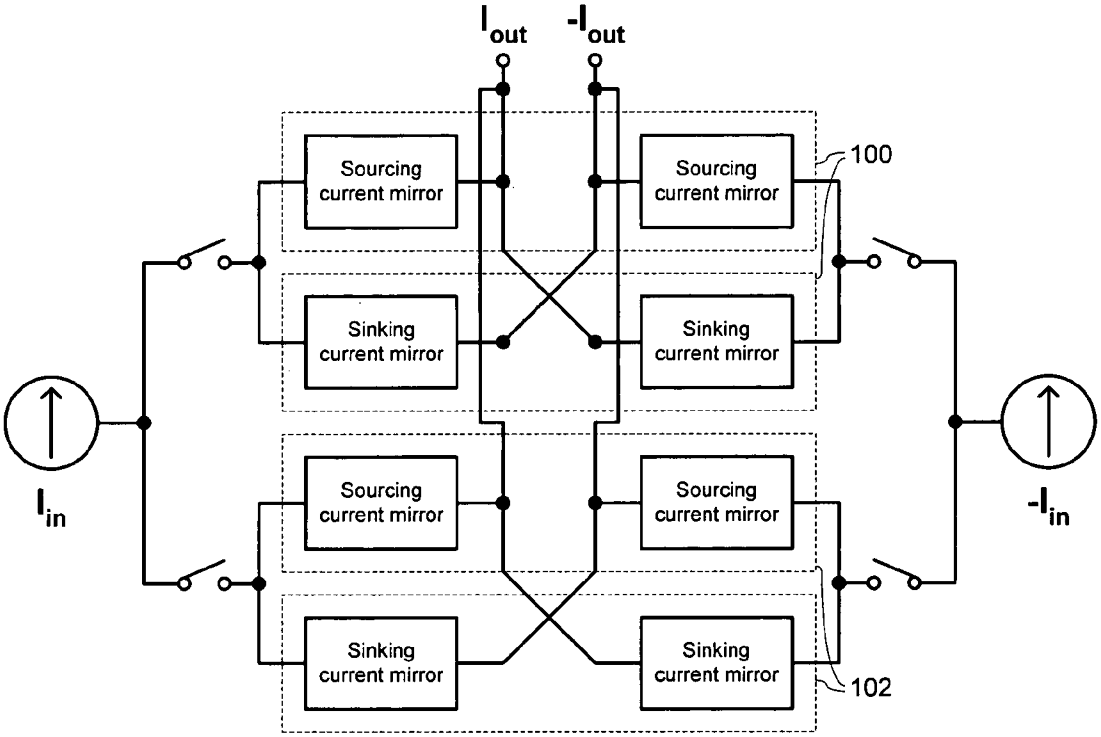
FIG. 5 shows a block level schematic diagram of an open loop output stage circuit in accordance with a third preferred embodiment of the invention.

FIG. 5 shows a block diagram of an output stage circuit in accordance with a third preferred embodiment of the invention. The output stage circuit of FIG. 5 differs from the output stage circuit of FIG. 2 in that multiple sets 100, 102 of matched sourcing current mirrors and sinking current mirrors are coupled to the output nodes, with each set being switchable into and out of the circuit. Each of the sets provides a given ratio of output current to input current. Consequently, by switching sets in and out, various ratios for the circuit as a whole can be achieved.

Figure 6:
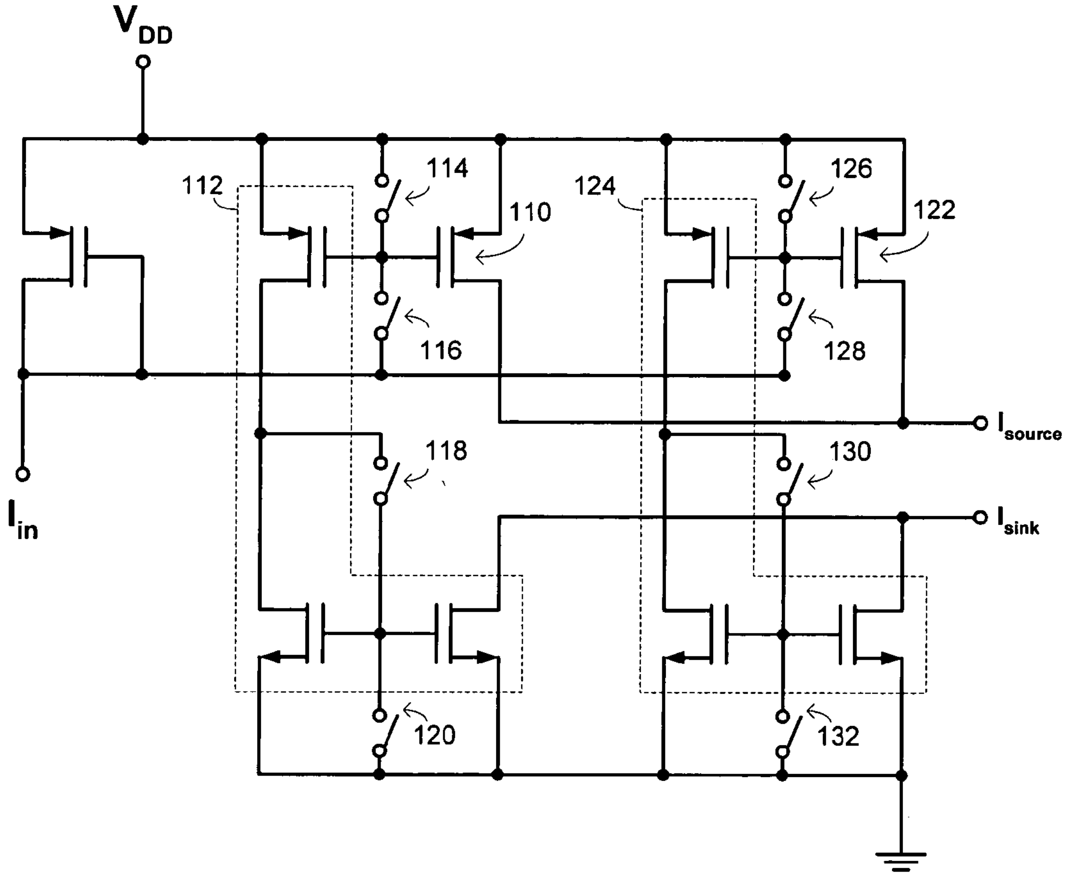
FIG. 6 shows a component level schematic diagram of one side of an output stage circuit in accordance with the third preferred embodiment of the invention.

FIG. 6 shows a circuit level diagram of one side of an output stage circuit in accordance with the third preferred embodiment of the invention. In the circuit of FIG. 6, a first sourcing current mirror 110 and sinking current mirror 112 are provided for mirroring an input current $I_{in}$ with a first ratio. Switches 114, 116, 118, 120 are provided for switching the gates of the transistors between an operative position and an off position. In the off position, the gates of the PMOS transistors are coupled to $V_{DD}$ and the gates of the NMOS transistors are coupled to ground, effectively removing those sourcing and sinking current mirrors from the output stage. The circuit of FIG. 6 also includes a second sourcing current mirror 122 and sinking current mirror 124 for mirroring an input current $I_{in}$ with a second ratio, which may be the same as or different than the first ratio provided by the first sourcing current mirror 110 and sinking current mirror 112. Switches 126, 128, 130, 132 are provided for switching the gates of the transistors between an operative position and an off position. Although not shown in FIG. 6, complementary matched sourcing and sinking current mirrors are provided for each of the illustrated sourcing and sinking current mirrors to mirror a complementary input signal $-I_{in}$.

Further embodiments may be implemented in addition to those illustrated herein. For example, while the circuit of FIGS. 5 and 6 shows the use of two sets of switchable sourcing and sinking current mirrors, additional sets may be used. Further, the impedance control implemented in the circuit of FIG. 4 may also be implemented in the circuits of FIGS. 5 and 6 and in alternative circuits.

The output stage circuits described herein may be implemented in a variety of devices. In general terms, the output stage circuits described herein may be implemented to provide open loop reduction of DC offset and removal of DC bias in any circuit that handles differential signals. Examples of circuits in which such output stages may be implemented include mixers, amplifiers and current mode down-converters.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other types of purposes. Thus, while the embodiments illustrated in the figures and described above are presently preferred for various reasons as described herein, it should be understood that these embodiments are offered by way of example only. The invention is not limited to a particular embodiment, but extends to various modifications, combinations, and permutations that fall within the scope of the claims and their equivalents.

What is claimed is:

1. An output stage for a current mode circuit, comprising:

a first reference transistor for receiving an input current $I_{in}$ comprised of a DC bias component $I_{DC1}$ and a signal component $I_{sig}$;

a first sourcing current mirror for producing a mirror of the input current $I_{in}$ at a first output node;

a first sinking current mirror for producing a mirror of the input current $I_{in}$ at a second output node, the polarity of current produced by the first sinking current mirror being opposite to the polarity of current produced by the first sourcing current mirror;

a second reference transistor for receiving a complementary input current $-I_{in}$ comprised of a DC bias component $I_{DC2}$ and a signal component $-I_{sig}$;

a second sourcing current mirror for producing a mirror of the complementary input current $-I_{in}$ at the second output node; and a second sinking current mirror for producing a mirror of the complementary input current $-I_{in}$ at the first output node, the polarity of current produced by the second sinking current mirror being opposite to the polarity of current produced by the second sourcing current mirror.

2. The output stage claimed in claim 1, wherein the first and second sourcing current mirrors and the first and second sinking current mirrors provide approximately equal gains.

3. The output stage claimed in claim 1, wherein the first sinking current mirror comprises:

a first mirror transistor for producing a mirror of the input current $I_{in}$ in a third reference transistor; and a second mirror transistor for producing a mirror of the current in the third reference transistor at the second output node, and wherein the second sinking current mirror comprises:

a third mirror transistor for producing a mirror of the complementary input current $-I_{in}$ in a fourth reference transistor; and a fourth mirror transistor for producing a mirror of the current in the fourth reference transistor at the first output node.

4. The output stage claimed in claim 3, wherein the first reference transistor and the second reference transistor are matched transistors, wherein the first sourcing current mirror, the second sourcing current mirror, the first mirror transistor and the third mirror transistor are matched transistors, and wherein the third reference transistor, the fourth reference transistor, the second mirror transistor and the fourth mirror transistor are matched transistors.

5. The output stage claimed in claim 1, wherein the first sourcing current mirror and the second sourcing current mirror comprise matched transistors.

6. The output stage claimed in claim 1, wherein the first reference transistor and the second reference transistor are matched transistors.

7. The output stage claimed in claim 1, further comprising respective transistors coupled between the first sourcing current mirror and the first output, between the second sourcing current mirror and the second output, between the first sinking current mirror and the second output, and between the second sinking current mirror and the first output, for receiving respective bias voltages at their gates to regulate output impedance of the output stage.

8. The output stage claimed in claim 1, further comprising respective switches for switching the first and second sourcing current mirrors and the first and second sinking current mirrors into and out of the output stage.

9. The output stage claimed in claim 1, further comprising:

a third sourcing current mirror for producing a mirror of the input current $I_{in}$ at the first output node;

a third sinking current mirror for producing a mirror of the input current $I_{in}$ at the second output node, the polarity of current produced by the third sinking current mirror being opposite to the polarity of current produced by the third sourcing current mirror;

a fourth sourcing current, mirror for producing a mirror of the complementary input current $-I_{in}$ at the second output node; and a fourth sinking current mirror for producing a mirror of the complementary input current $-I_{in}$ at the first output node, the polarity of current produced by the fourth sinking current mirror being opposite to the polarity of current produced by the fourth sourcing current mirror.

10. The output stage claimed in claim 9, further comprising:

respective switches for switching the first and second sourcing current mirrors and the first and second sinking current mirrors into and out of the output stage; and respective switches for switching the third and fourth sourcing current mirrors and the third and fourth sinking current mirrors into and out of the output stage.

11. The output stage claimed in claim 10, wherein the first and second sourcing current mirrors and the first and second sinking current mirrors produce output currents having a first ratio to the input currents, and wherein the third and fourth sourcing current mirrors and the third and fourth sinking current mirrors produce output currents having a second ratio to the input currents.

12. The output stage claimed in claim 11, wherein the first ratio is approximately equal to the second ratio.

13. The output stage claimed in claim 11, wherein the first ratio is different than the second ratio.

14. A method for reducing DC bias in a differential signal pair, comprising:

receiving an input current $I_{in}$ and a complementary input current $-I_{in}$, the input current $I_{in}$ being comprised of a DC bias component $I_{DC1}$ and a signal component $I_{sig}$, and the complementary input current $-I_{in}$ being comprised of a DC bias component $I_{DC2}$ and a signal component $-I_{sig}$;

supplying a first mirror of the input current $I_{in}$ to a first output node;

supplying a second mirror of the input current $I_{in}$ to a second output node, the second mirror of the input current $I_{in}$ having a polarity with respect to the second output node that is opposite the polarity of the first mirror of the input current $I_{in}$ with respect to the first output node;

supplying a first mirror of the complementary input current $-I_{in}$ to the second output node, the first mirror of the complementary input current $-I_{in}$ having a polarity with respect to the second output node that is the same as the polarity of the second mirror of the input current $I_{in}$ with respect to the second output node; and supplying a second mirror of the complementary input current $-I_{in}$ to the first output node, the second mirror of the complementary input current $-I_{in}$ having a polarity with respect to the first output node that is the same as the polarity of the first mirror of the input current $I_{in}$ with respect to the first output node.

* * * * *